United States Patent

[11] 3,634,203

[72] Inventors William R. McMahon
Richardson;
Thomas H. Ramsey, Jr., Garland, both of Tex.

[21] Appl. No. 843,642
[22] Filed July 22, 1969
[45] Patented Jan. 11, 1972

[73] Assignee Texas Instruments Incorporated
Dallas, Tex.

[54] THIN FILM METALLIZATION PROCESSES FOR MICROCIRCUITS
8 Claims, 25 Drawing Figs.

[52] U.S. Cl. .......... 204/15, 317/234 R
[51] Int. Cl. .......... C23b 5/48, H01l 11/00
[50] Field of Search .......... 204/15; 317/234; 117/212

[56] References Cited
UNITED STATES PATENTS

| | | | |
|---|---|---|---|
| 3,169,892 | 2/1965 | Lemelson | 317/234 |
| 3,337,426 | 8/1967 | Celto | 204/15 |
| 3,461,347 | 8/1969 | Lemelson | 317/101 |
| 3,468,728 | 9/1969 | Martin | 29/577 |
| 3,518,506 | 6/1970 | Gates | 317/235 |

*Primary Examiner*—John H. Mack
*Assistant Examiner*—T. Tufariello
*Attorneys*—James O. Dixon, Andrew M. Hassell, Harold Levine, Melvin Sharp, John E. Vandigriff, Henry T. Olsen, Michael A. Sileo, Jr. and Gary C. Honeycutt

ABSTRACT: Selective anodic oxidation is employed to pattern thin metallic films in the fabrication of printed circuit boards and integrated microcircuits to provide "inlaid" metallization geometry and thereby eliminate the need for selective etching of metal films. The total anodic conversion of metallic thin films to the corresponding oxide is demonstrated. Standard photolithographic masking techniques are employed to achieve selective anodic oxidation in the delineation of a single metal film, and also for each successive metallization layer in the fabrication of integrated microcircuits having multilevel, insulated, interconnecting metallization patterns.

INVENTORS
William R. McMahon
Thomas H. Ramsey, Jr.
BY
ATTORNEY

THIN FILM METALLIZATION PROCESSES FOR MICROCIRCUITS

This invention relates to the patterning of thin metal films, and more particularly, to selective anodic oxidation as a method for patterning, isolating and insulating metallic thin-film electrical leads.

The most commonly practiced method for providing an integrated semiconductor network with ohmic contacts and electrical leads involves the deposition of aluminum metal, followed by selective etching to remove undesired portions of the aluminum film. Such a method begins with the processing of a silicon wafer, after all impurity diffusions have been completed, having a passivation layer of silicon oxide remaining on the silicon surface. By the use of standard photolithographic techniques, the oxide layer is selectively etched to provide windows therein which expose the silicon surface at locations where ohmic contacts are to be formed. The wafer is then cleaned and placed in a vacuum evaporation apparatus, typically a bell jar. A source of aluminum metal is coiled around a tungsten filament within the bell jar, and a sufficient voltage is applied to the filament for the purpose of melting and vaporizing the aluminum. A thin film of aluminum metal is thereby deposited on the entire surface of the wafer. The bell jar is then backfilled and the aluminized wafer is removed. The aluminum film is then masked with a patterned photoresist film. The wafer is immersed in a sodium hydroxide solution, as a selective etch, to remove the unmasked portions of the aluminum film and thereby provide the desired pattern of ohmic contacts and electrical leads. As a final step, the wafer is usually baked at a temperature slightly above the silicon aluminum eutectic in order to obtain a shallow alloy layer to improve the reliability of ohmic contact.

In the above sequence the most difficult step to control is that of selectively etching the aluminum film. Insufficient etching is frequently responsible for leaving a metal bridge between adjacent leads, through failure to remove all the unwanted aluminum. On the other hand, excessive etching frequently causes an open circuit due to the inadvertent removal of aluminum at one or more locations under the photoresist pattern.

Moreover, even when the etch step is properly controlled, this technique inherently provides a metallization pattern which is slightly raised above the level of the surrounding oxide layer. Such a raised metal profile is particularly sensitive to damage caused by accidental mechanical abrasion or scratching of the wafer surface during routine handling.

The above-noted shortcomings of conventional metallization processes become even more troublesome with increasing circuit complexity. For example, if a second level of metallization is required, the crossover points produce an even more exaggerated irregularity in the surface layer. Such irregularities quickly become intolerable, particularly when raised electrical studs are required in connection with face-down bonding of the semiconductor circuit chip.

It is an object of the invention to provide an improved method for the formation of a patterned conductive film on a substrate surface, without etching. It is a further object of the invention to provide an improved method for the fabrication of plural level, insulated, interconnecting patterns of thin metal film on a substrate surface.

A further object of the invention is to fabricate semiconductor devices having a superior system of thin-film metallization. It is a more particular object of the invention to provide a semiconductor device having thin-film electrical contacts and leads characterized by extremely small step heights, and thereby to facilitate the fabrication of multilevel crossover metallization patterns. It is also an object of the invention to increase the mechanical and chemical stability of metallization layers on the integrated circuits. It is still a further object to improve the reproducibility and reliability achieved in face-down bonding of integrated circuit structures.

Among the other objects of the invention are included the provision of closer lead spacing, tighter device geometry, higher breakdown voltage between levels of multilevel metallization systems, and improved current density capabilities for metallization systems of integrated circuits.

One aspect of the invention is embodied in a method for the selective metallization of a substrate, beginning with the step of depositing on the substrate a metal film having the desired thickness. A photoresist layer is then patterned on the metal film and developed to provide a photoresist image corresponding to the desired metallization pattern. The substrate carrying the metal film and photoresist pattern is then immersed in a suitable electrolytic bath where the metal layer is connected as the anode of an electrochemical oxidation cell. Upon the application of a suitable DC voltage, selective oxidation of the metal film begins in those areas not covered by the photoresist pattern. The oxidation front deepens uniformly at a rate substantially proportional to the current flow, until the complete thickness of the unmasked portions of the metal film is converted to the oxide, while the masked portions of the film are unaffected, thereby providing an inlaid metal pattern contacting the substrate surface.

As applied to the fabrication of a semiconductor device, the above sequence of steps begins, for example, with the deposition of a metal film on an oxidized semiconductor wafer having windows in the oxide layer at locations where ohmic contact with the semiconductor substrate is desired. A photoresist layer is then applied to the metal film, the photoresist pattern corresponding identically to the desired metallization pattern. The composite structure is then immersed in electrolytic cell where the metal film is connected as the anode for selective oxidation of the unmasked portions of the metal film, thereby producing an inlaid metallization pattern establishing ohmic contact with the semiconductor substrate through the windows provided in the oxide layer. Although the oxide produced by selective anodization has a density somewhat less than that of the original metal film, the increase in volume upon oxidation is relatively small. The resulting composite film is very nearly stepless, thereby providing a dramatic increase in resistance to mechanical abrasion relative to conventional stepped metallization patterns.

In accordance with one variation of the above embodiment, the metallized wafer surface is first subjected to nonselective anodic oxidation for a brief period of time, sufficient to oxidize only a small fraction of the thickness of the metal film, followed by removal of the wafer from the electrolytic bath and the patterning of a photoresist layer on the partially oxidized metal film. The wafer is then returned to the electro'ytic bath for selective anodic oxidation of the remaining thickness of the metal film. The result is an inlaid and overcoated pattern of metallization, thereby providing even greater resistance to abrasion damage.

In accordance with a further embodiment of the invention, a plural level metallization pattern is provided by a sequence of steps which begins, as above, with the deposition of a metal film of a desired thickness on an oxidized semiconductor wafer having windows in the oxide at locations where ohmic contact with the semiconductor is desired. Next, a photoresist pattern is formed on the metal film at location where feedthrough connection are desired between the first and second levels of metallization. The metal film is then subjected to a selective, partial anodic oxidation followed by removal of the wafer from the electrolytic bath and formation of a second photoresist pattern on the partially oxidized metal film, the second photoresist pattern corresponding to the exact pattern desired for the electrical lead definition of the first metallization layer. The wafer is then returned to the electrolytic bath, where the metal film is further anodized to complete the formation of an inlaid pattern having exposed metal surfaces only at the feedthrough locations. Thereafter a second level metallization is provided in accordance with the technique of the present invention; or, if desired, by any known technique. If a third or subsequent level of metallization is desired, the technique of the present invention is particularly preferred for each layer.

A somewhat different approach is useful in the fabrication of an insulated gate, field-effect transistor. Initially, a metal film having the desired thickness is applied directly to the surfaces of a semiconductor wafer having source and drain regions diffused therein. A photoresist layer is patterned on the metal film, covering only those portions of the metal film to be retained as ohmic contacts to the source and drain regions. The wafer is then immersed in a suitable electrolyte where the metal film is connected as the anode of an electrolytic oxidation cell. The complete thickness of the exposed portions of the metal film is then converted to the oxide, followed by a removal of the wafer from the electrolytic bath and the deposition of a second metal film. A second layer of photoresist is patterned on the second metal film covering both of the locations of the ohmic contacts to the source and drain, as well as the portion selected to serve as the gate electrode. The wafer is returned to the electrolytic bath for a selective oxidation of the unmasked portions of the second metal film. The result is a MOS device having inlaid source and drain contacts as well as an inlaid gate electrode.

These and other embodiments of the invention are illustrated by the attached drawings wherein:

FIGS. 1*a* through 1*c* are cross-sectional views of a metallized substrate, illustrating a sequence of steps for providing the substrate with an inlaid metallization pattern.

FIGS. 2*a* through 2*d* are cross-sectional views of a metallized substrate, illustrating an alternate sequence of steps for providing the substrate with an inlaid metallization pattern.

FIGS. 3*a* through 3*e* are cross-sectional views of a metallized substrate, illustrating a sequence of steps for providing the substrate with an inlaid and overcoated metallization pattern having feedthrough locations for interconnection with electrical leads, or with second level metallization.

FIGS. 4*a* and 4*b* illustrate the anodic oxidation of etched metallization patterns.

FIGS. 5*a* through 5*c* are cross-sectional views of a substrate, illustrating a sequence of steps for selectively anodizing etched leads to provide inlaid bonding pads.

FIG. 6 is a cross-sectional view of a metallized substrate, illustrating crossover and feedthrough locations in a two-layer metal film.

FIGS. 7*a* through 7*c* are cross-sectional views of a metallized substrate, illustrating the fabrication of a MOS device.

Figure 1A:
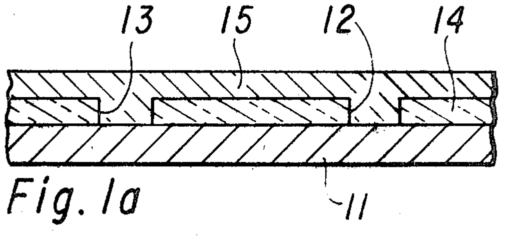

IN FIG. 1*a*, substrate 11 is a monocrystalline silicon wafer having various PN-junction formed therein by the selective diffusion of impurities to create regions of P-type and N-type conductivity (not illustrated), to which ohmic contact is made by selective metallization through windows 12 and 13 of silicon dioxide layer 14. The first step involves the deposition of aluminum film 15 which is accomplished by any of various known techniques. It is preferred, in accordance with the invention, to deposit the aluminum by means of an electron gun evaporator. It is essential for best results to limit the rate of aluminum deposition to less than 30 angstroms per second, the preferred rate being from 6 to 20 angstroms per second. A total thickness of about 40 microinches is suitable for the illustrated embodiment.

Figure 1B:
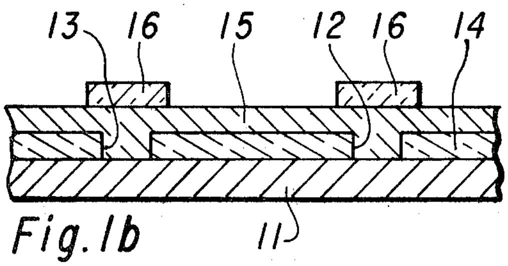

As shown in FIG. 1*b*, the structure of FIG. 1*a* is provided with a photoresist pattern 16. The photoresist pattern is applied using known techniques and materials, including, for example, Eastman-Kodak's KMER and Shipley's AZ Resist. These materials are applied and patterned by photographic techniques well known in the semiconductor art. In accordance with the present invention, the resist pattern is located to cover the exact areas of metal film 15 which are to be preserved as metal contacts and electrical leads, while the unexposed areas are to be converted by selective anodic oxidation.

Figure 1C:
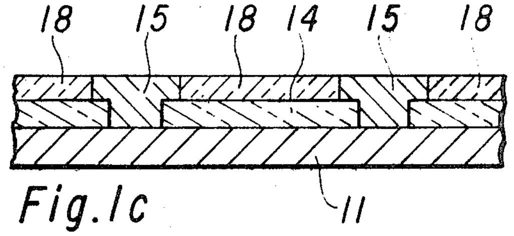

FIG. 1*c*illustrates the completed metallization pattern produced by immersing the structure of FIG. 1*b* in a suitable electrolytic bath, wherein film 15 is electrically connected as the anode of an electrochemical cell. The application of a suitable DC voltage converts selected areas 18 of film 15 to aluminum oxide, providing an inlaid pattern of ohmic contacts and electrical leads 15.

In this embodiment, the electrolytic bath comprises 7.5 percent by weight oxalic acid dissolved in deionized water. A current density of 30 milliamps per square inch of wafer surface is achieved by imposing a potential difference of 30 volts DC between the wafers and a suitable cathode also immersed in the oxalic acid bath. An oxide growth rate of 2–3 microinches per minute is observed under these conditions. It is particularly significant that the anodization step proceeds smoothly and uniformly to completion: that is, the complete thickness of film 15 is converted to aluminum oxide layer 18 in those areas not covered by photoresist.

Figure 2A:
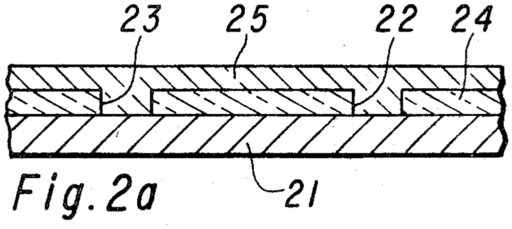

An alternate embodiment for producing an inlaid metallization pattern is illustrated in FIGS. 2*a* through 2*d*, wherein the inlaid pattern is overcoated with a layer of aluminum oxide. In FIG. 2*a*, substrate 21 is a silicon wafer having diffused junctions therein similarly as in substrate 11. Windows 22 and 23 of oxide layer 24 are provided for the purpose of establishing ohmic contact to the surface of wafer 21. The initial step, as before, is the deposition of aluminum film 25 in accordance with known techniques.

The metallized wafer, as shown in FIG. 2*a*, is immersed in an electrolytic bath for nonselective anodic oxidation of a portion of film 25. The resulting structure is shown in FIG. 2*b*, which includes aluminum oxide layers 26.

Figure 2B:
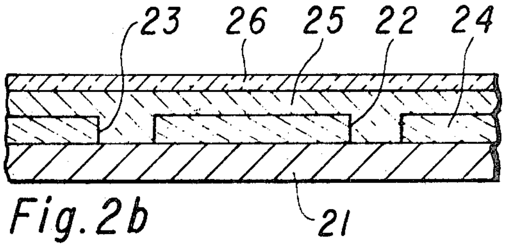
Figure 2C:
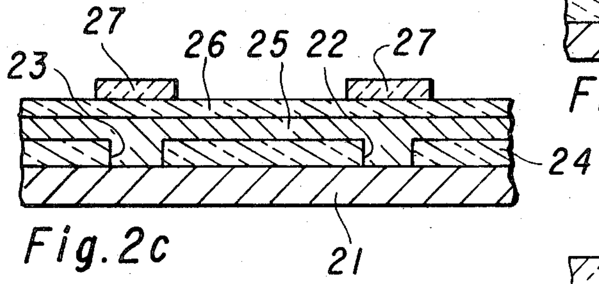

The structure of FIG. 2*b* is then coated with a suitable photoresist to provide pattern 27, as illustrated in FIG. 2*c*. Pattern 27 is designed to protect those portions of film 25 to be protected from anodization. The wafer is then returned to the anodization bath where the unprotected portions of film 25 are totally converted to aluminum oxide, resulting in a structure of FIG. 2*d*. The inlaid and overcoated pattern 25 of ohmic contacts and electrical leads is fully protected from chemical and/or mechanical damage. Subsequently, if desired, windows may be selectively etched in the overcoating of aluminum oxide to establish electrical contact between pattern 25 and surface contacts or second level metallization. A suitable etchant for the oxide, which will not attack the metal, is an aqueous solution of chromic and phosphoric acids prepared, for example, by adding 20 g. $CrO_3$ and 35 ml. concentrated $H_3PO_4$ (85 percent) to a 1-liter flask and diluting to volume with water. The solution is used at about 100° C.

Figure 2D:
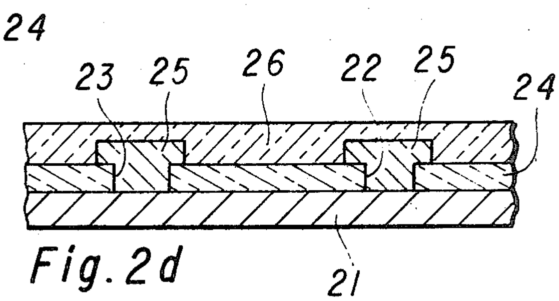
Figure 3A:
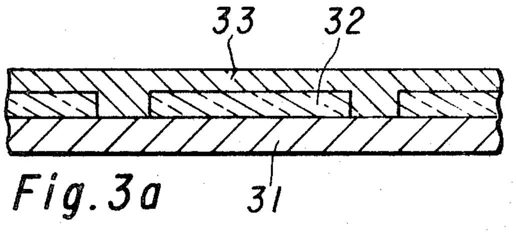
Figure 3B:
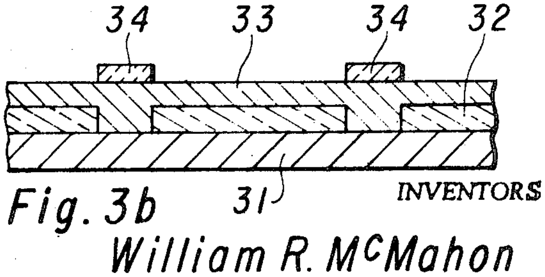
Figure 3C:
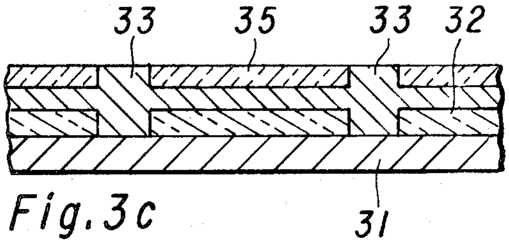

The embodiment of FIG. 2*d* is readily modified to add a pattern of inlaid feedthrough connections to the surface of oxide layer 26. Such a modification is shown in the sequence illustrated by FIGS. 3*a* through 3*e*. The structure of FIG. 3*a* includes substrate 31 coated by oxide layer 32 and aluminum film 33 which is identical to the structure of FIG. 2*a*. As shown in FIG. 3*b*, metal film 33 is coated with a photoresist layer 34 patterned to protect those areas of film 33 to be preserved as feedthrough elements in the completed structure. The wafer is then placed in a suitable electrolytic bath for selective anodization, whereby the composite film structure of FIG. 3*c* is produced, including anodized layer 35. The wafer is removed from the anodization bath and is provided with a second photoresist layer 36 patterned to protect a potion of film 33 during subsequent anodization. The wafer is returned to the anodization bath where the remaining thickness of film 33 is converted to oxide, except where protected by photoresist pattern 36. The result is an inlaid and overcoated metallization pattern of contacts and electrical leads including feedthrough elements exposed at the surface of anodized layer 35.

Figures 3D, 3E, 4A, 4B, 5A, 5B, 5C, 6, 7A, 7B, 7C:
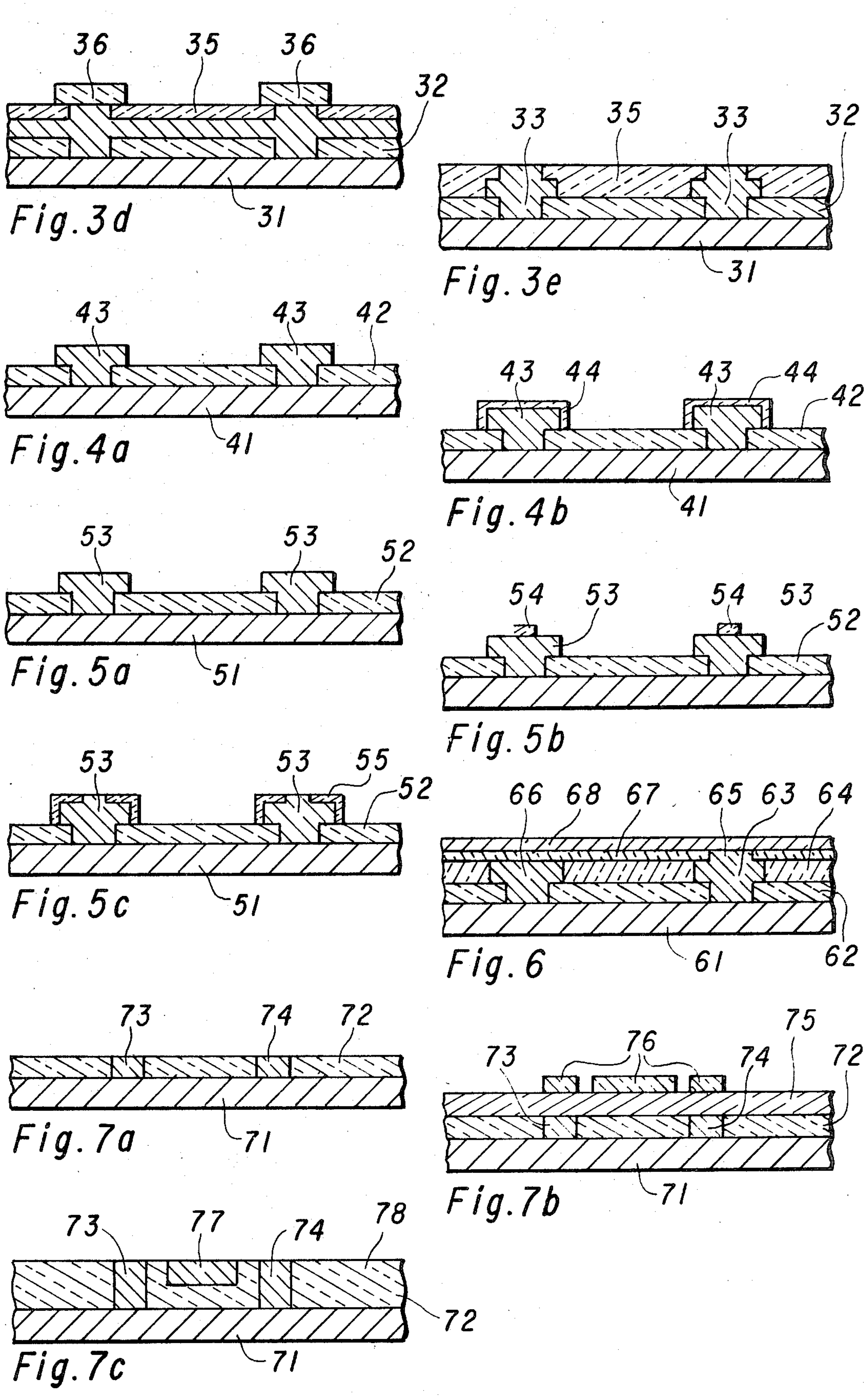

The anodization of metal films patterned in accordance with prior techniques is also possible as illustrated in FIGS. 4*a* and 4*b*, where substrate 41, coated by oxide layer 42 and including metallized film contacts 43, is immersed in the anodization bath, wherein metal leads 43 are connected as the anode for the purpose of partial conversion to aluminum oxide layer 44.

The embodiment of FIG. 4*b* is readily modified in accordance with the invention to provide anodized protection for the lead pattern, while at the same time-preserving feedthrough elements exposed at the surface of the anodized layer. Such an embodiment is illustrated in FIGS. 5*a* through 5*c*. In FIG. 5*a*, substrate 51 is covered with oxide layer 52, wherein windows are provided for the formation of ohmic contacts 53, similarly as shown in FIG. 4*a*. The wafer is then provided with photoresist layer 54 patterned to protect a portion of leads 53 as feedthrough elements. The wafer is then immersed in a suitable anodization bath where leads 53 are connected as the anode. Partial oxidation of the protected leads produces the structures illustrated in FIG. 5*c*.

In FIG. 6, an embodiment is illustrated which is similar to that of FIG. 3*e*, except for omission of one of the feedthrough elements, and the addition of a second level metallization film. That is, substrate 61 is provided with an oxide coating 62 through which first layer metallization film 63 extends. Aluminum oxide layer 64 is produced by anodization, as in the embodiment of FIG. 3*e*, during which anodization the first photoresist layer is patterned to provide a feedthrough element 65, but without providing a similar feedthrough element for metal contact 66. Accordingly, aluminum oxide layer 67 provides electrical insulation between top metal layer 68 and metal contact 66.

In FIG. 7*a*, substrate 71 is a monocrystalline silicon wafer of one conductivity type having source and drain regions of opposite conductivity type diffused therein (not illustrated). An aluminum film is deposited directly on the substrate surface. Since the film thickness determines the insulator thickness between the gate electrode and the semiconductor, such thickness is preferably limited to less than 2 microinches. About 1 microinch, for example, is optimum for some purposes. The aluminum film is selectively anodized in accordance with the method of the invention to provide inlaid metal contacts 73 and 74, establishing ohmic contact with the source and drain regions, respectively, surrounded by aluminum oxide film 72. As shown in FIG. 7*b*, a second film 75 of aluminum is deposited over the composite film of FIG. 7*a*. Next, after this layer 76 is patterned for subsequent selective anodization of film 75, as shown in FIG. 7*c*, the resulting structure is a MOS device including an inlaid gate electrode 77 spaced intermediate inlaid source and drain contacts 73 and 74, all of which extend flush with the surface of anodic oxide layers 72 and 78.

Figure 8:
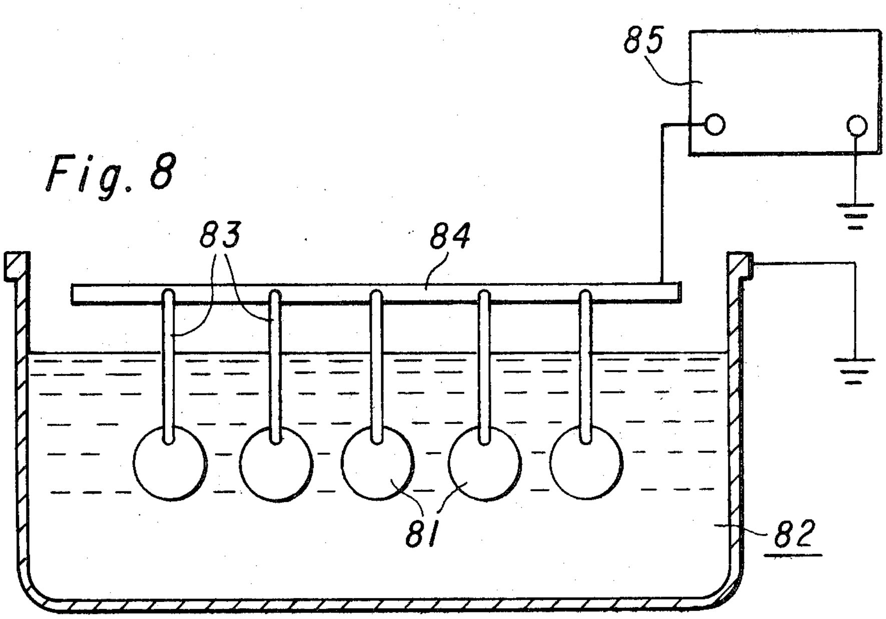
FIG. 8 is a schematic cross-sectional view of selective anodic oxidation apparatus for use in practicing the invention.

In FIG. 8, a suitable system of apparatus is illustrate for use in the anodization step of the invention. Semiconductor wafers 81 are suspended within electrolyte 82 by means of clamps 83 mounted on bar 84 which is connected to the positive terminal of DC power supply 85. Tank 86 may serve as the cathode, as illustrated, or a separate cathode may be provided. Suitable examples of electrolyte solution include sulfuric acid, tataric acid, and oxalic acid. A wide range of electrolyte concentrations is useful, as can readily be determined by reference to known processes for anodization. Potential differences from 20 to 200 volts DC have been used to produce current densities ranging from 4 to 40 milliamperes per square centimeter of aluminum film. Preferred concentrations are from 1 to 15 percent by weight.

Figures 9, 10, 11:
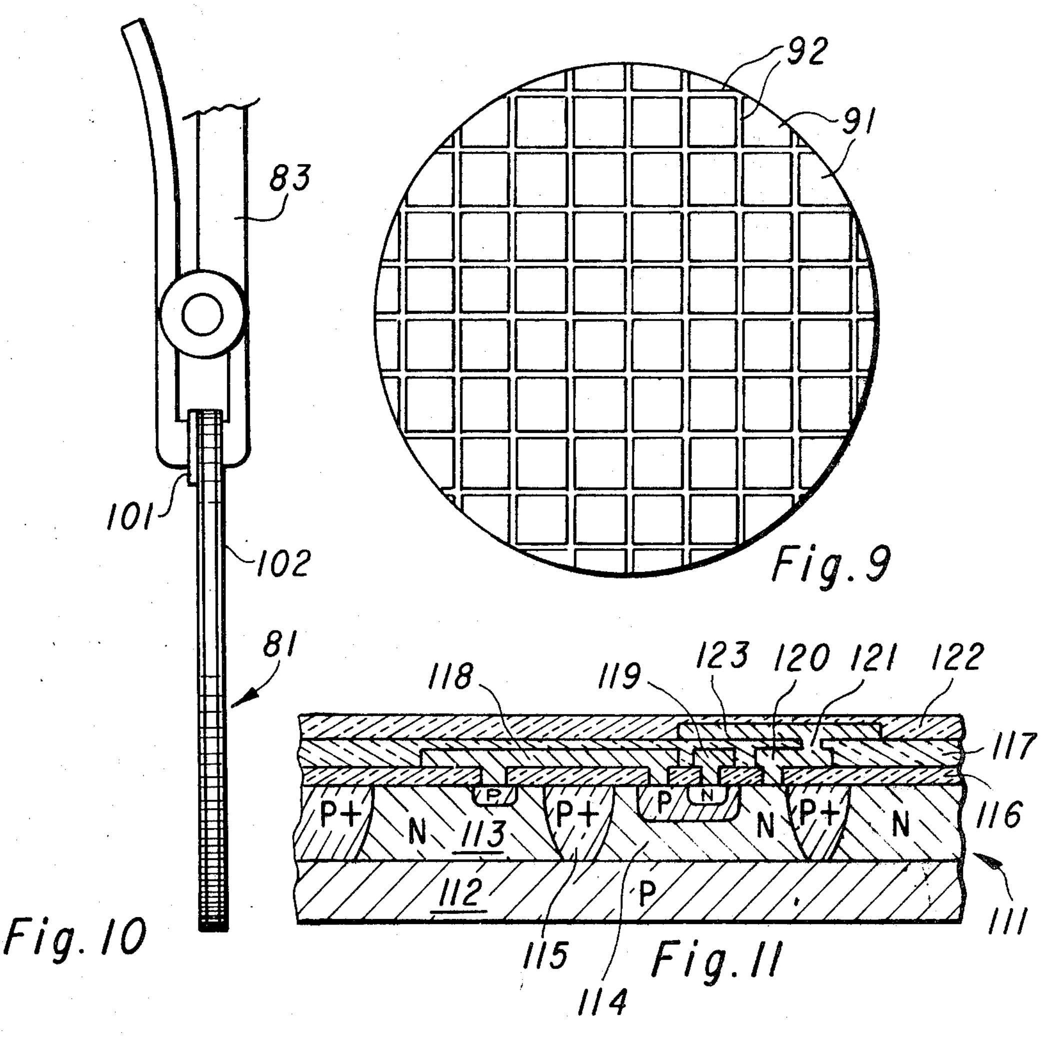
FIG. 9 is a plan view of a semiconductor wafer, illustrating the use of a metal grid pattern for the uniform distribution of anodization current.
FIG. 10 is a side view of a semiconductor wafer illustrating means for suspension in the anodization bath.
FIG. 11 is a cross section of an integrated semiconductor network having two levels of metallization.

In FIG. 9, a semiconductor wafer is illustrated, wherein the scribe line grid is provided with a network of aluminum film for the purpose of distributing the anodization current uniformly across the face of the wafer.

In FIG. 10, an enlarged view is shown of clamp 83 attached to wafer 81 showing a suitable method for suspension within electrolyte bath 82. A rubber pad 101 or other insulation is provided on one side of clamp 83 as a means of avoiding electrical contact to both sides of wafer 81. That is, metallic contact is made selectively to metallization film 102.

Although the invention is described with reference to aluminum as the preferred metal film, a large number of other metals can readily be anodized and are therefore within the scope of the invention, including titanium, tantalum, molybdenum and zirconium, for example.

In FIG. 11, semiconductor network 111 includes P-type substrate 112 having an N-type epitaxial layer thereon in which are located regions 113 and 114 electrically isolated by means of P+ regions 115. The illustrated portion of the circuit includes a diffused resistor in region 113, a transistor in region 114, and a metallization pattern which establishes ohmic contact therewith through windows in oxide layer 116.

The metallization pattern is formed in accordance with the invention by first depositing an aluminum film having the thickness and location of aluminum oxide film 117. A photoresist pattern is added to define feedthrough location 121 during initial anodization, after which a new photoresist pattern is applied to define metal patterns 118, 119 and 120 during continued anodization.

A second aluminum film is deposited having the thickness and location of aluminum oxide film 122. Partial anodization if effected without masking to produce a thin overcoat of aluminum oxide, followed by the application of a photoresist pattern to define metal film 123 during continued anodization. It will be apparent that the resulting two-level pattern corresponds to the embodiment of FIG. 6.

Although the invention has been described with reference to the selective anodization of a metal film, conversion methods other than anodization may be used. For example, the selective exposure of an oxidizable conductor film to oxygen or other oxidizing agent will convert the exposed portions to an insulator. In such an example, selected portions of the conductor film are masked against the effect of the oxidizing agent by any adherent film that is substantially more resistant to oxidation than the conductor film.

What is claimed is:

1. In the fabrication of an integrated semiconductor microcircuit wherein PN-junctions are passivated by an insulation layer, and wherein access windows are provided in the insulation layer for permitting ohmic contacts to be made to selected semiconductor regions, the improvement comprising:

depositing a conductor film on said windowed insulation layer; and electrolytically converting selected portions of said conductor film to a nonconductor.

2. A method as defined by claim 1 wherein said converting step includes the step of masking a selected area of the conductor film and selectively converting the entire thickness of the unmasked portion to a nonconductor electrolytic anodization.

3. A method as defined by claim 2 wherein the converting step comprises immersing the masked structure in an electrolytic bath, connecting the conductor as the anode of an electrolytic cell, and passing a suitable current through the cell, whereby the exposed areas are selectively oxidized.

4. A method for the selective metallization of a substrate comprising:

forming an insulation film on said substrate;

forming openings in said insulation film at location where electrical contact is desired to subjacent material;

depositing a metal film on said insulation film; selectively masking said metal film to provide a mask pattern corresponding to the desired metallization pattern; and electrolytically converting the unmasked areas of said metal film to a nonconductor to form an inlaid metallization pattern.

5. A method for the selective metallization of a substrate comprising:

forming an insulation film on said substrate;

forming openings in said insulation film at locations where electrical contact with the substrate is desired;

depositing a metal film on said insulation film;

electrolytically converting a portion of the thickness of said metal film to a nonconductor;

selectively masking the converted metal surface to provide thereon a mask pattern corresponding to the desired metallization pattern; and electrolytically oxidizing the remaining thickness of the unmasked area of said metal film.

6. A method for the formation of a thin-film metallization pattern on a substrate comprising:

forming an insulation film on said substrate;

opening windows in said insulation film at locations where ohmic contact with the substrate is desired;

depositing a metal film on the resulting composite;

forming a first selective masking pattern on said first metal film at locations where surface contacts to said metal film are desired;

electrolytically oxidizing a portion of the thickness of the unmasked area of said metal film;

forming a second selective masking pattern on the resulting partially oxidized first metal film, said pattern corresponding to the desired geometry of said metal film; and electrolytically oxidizing the remaining thickness of the unmasked areas of said first metal film:

7. A method as defined by claim 6 further including the step of depositing and patterning a second metal film on the composite surface of the structure produced in accordance with claim 6.

8. A method for the fabrication of a semiconductor device comprising:

forming first and second spaced apart regions of one conductivity type adjacent a surface of a semiconductor substrate of opposite conductivity type;

depositing a first metal film on said surface, covering said first and second regions;

electrolytically oxidizing the complete thickness of said metal film to form an insulation film adjacent said first and second regions;

depositing a second metal film on said insulation film;

patterning said second metal film to form a gate electrode;

selectively etching the resulting oxide films to expose portions of said first and second regions of one conductivity type; and forming ohmic contacts with said first and second regions of one conductivity type.

* * * * *

Notice of Adverse Decision in Interference

In Interference No. 98,018, involving Patent No. 3,634,203, W. R. McMahon, and T. H. Ramsey, Jr., THIN FILM METALLIZATION PROCESSES FOR MICROCIRCUITS, final judgment adverse to the patentees was rendered Dec. 1, 1973, as to claims 1, 2, 3 and 4.

[*Official Gazette July 8, 1975.*]